United States Patent
Durand

(10) Patent No.: US 10,928,626 B2
(45) Date of Patent: Feb. 23, 2021

(54) METHOD AND DEVICE FOR CORRECTING DEFORMATIONS OF A SURFACE AND MIRROR USING SAID METHOD AND/OR SAID DEVICE

(71) Applicant: COMMISSARIAT A L'ENERGIE ATOMIQUE ET AUX ENERGIES ALTERNATIVES, Paris (FR)

(72) Inventor: Gilles Durand, Rambouillet (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 223 days.

(21) Appl. No.: 15/782,358

(22) Filed: Oct. 12, 2017

(65) Prior Publication Data

US 2018/0106995 A1 Apr. 19, 2018

(30) Foreign Application Priority Data

Oct. 13, 2016 (FR) ...................... 16 59908

(51) Int. Cl.
*G02B 26/08* (2006.01)
*H01L 41/04* (2006.01)
(Continued)

(52) U.S. Cl.
CPC ....... *G02B 26/0858* (2013.01); *G02B 7/1815* (2013.01); *G02B 26/06* (2013.01);
(Continued)

(58) Field of Classification Search
CPC ............... G02B 26/0825; G02B 7/183; G02B 26/0858; G02B 27/0068; G02B 26/0833;
(Continued)

(56) References Cited

U.S. PATENT DOCUMENTS 4,257,686 A * 3/1981 Albertinetti ........... H01L 41/083
359/295
5,862,275 A * 1/1999 Takeuchi ............... G02B 26/08
310/324
(Continued)

FOREIGN PATENT DOCUMENTS

CA 639 128 A 4/1962
EP 2 199 836 A1 6/2010

OTHER PUBLICATIONS

Search Report as issued in French Patent Application No. 1659908, dated Aug. 28, 2017.
(Continued)

*Primary Examiner* — Jade R Chwasz
(74) *Attorney, Agent, or Firm* — Pillsbury Winthrop Shaw Pittman LLP

(57) ABSTRACT

A method for correcting deformations of the surface of an object equipped with a device for correcting deformations, the device including a piezoelectric layer including first and second surfaces, a first plurality of electrical tracks arranged on the first surface, a second plurality of electrical tracks arranged on the second surface, the tracks of the first plurality forming a plurality of lines and the tracks of the second plurality forming a plurality of columns, each column of the plurality of columns being perpendicular to the lines of the plurality of lines, the crossing of a line and a column forming a pixel. The method includes measuring the deformations of the surface; identifying the pixels for correcting the deformations and applying, for each identified pixel, with the line and the column corresponding to the pixel, an electric field greater than the coercive field of the piezoelectric material of the piezoelectric layer.

8 Claims, 6 Drawing Sheets

(51) Int. Cl.
  *H01L 41/09* (2006.01)
  *G02B 7/18* (2006.01)
  *G02B 26/06* (2006.01)
  *G02B 27/00* (2006.01)

(52) U.S. Cl.
  CPC ..... *G02B 26/0825* (2013.01); *G02B 27/0025* (2013.01); *H01L 41/042* (2013.01); *H01L 41/0973* (2013.01); *H01L 41/04* (2013.01)

(58) Field of Classification Search
  CPC .... G02B 7/008; G02B 27/0025; G02B 26/06; G02B 7/1815; H01L 41/0973; H01L 41/042; H01L 41/04
  USPC .......................................................... 359/846
  See application file for complete search history.

(56) References Cited

U.S. PATENT DOCUMENTS

| | | | |
|---|---|---|---|
| 2003/0107789 A1* | 6/2003 | Hishioka | G02B 3/14 359/223.1 |
| 2006/0152830 A1 | 7/2006 | Farah | |

OTHER PUBLICATIONS

Kadota, Y., et al., Fatigue and retention properties of shape memory piezoelectric actuator with non-180° domain switching, Smart Materials and Structures, vol. 21, 2012, 10 pages.

Patterson, K., et al., "Thin Deformable Mirrors for a Reconfigurable Space Aperture," 53rd AIAA/ASME/ASCE/AHS/ASC Structures, Structural Dynamics, and Materials Conference, Apr. 2012, 13 pages.

* cited by examiner

METHOD AND DEVICE FOR CORRECTING DEFORMATIONS OF A SURFACE AND MIRROR USING SAID METHOD AND/OR SAID DEVICE

TECHNICAL FIELD OF THE INVENTION

The technical field of the invention is that of the correction of deformations of a surface of an object. The present invention relates to a method for correcting deformations of a surface of an object and in particular a correction method using the phenomenon of piezoelectric remanence. The present invention also relates to a device for correcting deformations of a surface of an object and a mirror equipped with such a device. Finally, the present invention relates to the use of a device forming the subject matter of the invention for the implementation of a method forming the subject matter of the invention.

TECHNOLOGICAL BACKGROUND OF THE INVENTION

Telescope mirrors have to be constructed with great precision in order to be able to guarantee good quality of the image obtained. The required precision is in general of the order of one twentieth of wavelength. Generally speaking, large telescopes are in the form of a plurality of mirrors of smaller size. For example, it is common to resort to 2 m mirror segments. For such mirrors, the precision is thus of the order of several nanometres, that is to say eight orders of magnitude less than the size of the actual mirror segment. The production of mirror segments with such precision requires a succession of numerous steps including notably stabilisation, preform machining, numerous steps of polishing and measuring. Moreover, when these mirrors are used cold, it becomes indispensable to include cryogenic cycles of stabilisation and measurement. Obviously, all of these steps lead to great manufacturing complexity as well as a high cost and produces mirrors having a significant weight.

In order to get away from these complex manufacturing methods, a technique of producing composite mirrors obtained by replication has been developed. However, mirrors obtained by this technique have deformation defects due to stresses that appear at the moment of polymerisation of the resins and differences in temperature between manufacture and use.

It is thus known to rectify these deformation errors by means of actuators situated on one of the surfaces of the mirror to correct. It is notably known to use actuators based on piezoelectric materials. To achieve this, a plate made of piezoelectric material is produced on which electrodes are arranged on each of the surfaces in order to define a plurality of lines on a first surface and a plurality of columns on a second surface opposite to the first, the lines being, in general, perpendicular to the columns. A pixel is thereby defined at each crossing between a line and a column. In other words, a plate comprising 10 lines and 10 columns makes it possible to form 100 pixels. The correction is carried out in three main steps. Firstly, an optical measurement is carried out on the mirror in order to identify the deformations of said mirror. Next, a step of identifying the pixels to actuate in order to correct the measured deformations is carried out. Finally, a step of applying a field enabling the deformation of the pixels identified during the preceding step is carried out.

An exemplary embodiment of such a system is detailed in the article "Thin Deformable Mirrors for a Reconfigurable Space Aperture", 53rd AIAA/ASME/ASCE/AHS/ASC Structures, Structural Dynamics, and Materials Conference (2012). In this document, the application of the electric field takes place in two stages. Firstly, a first cycle phase is applied to all of the pixels during which the electric field is taken on several occasions above the coercive field of the piezoelectric material used. This first cycle step makes it possible to obtain a deformation for each pixel which varies linearly as a function of the applied electric field. During the second phase, each identified pixel has the necessary electric field applied. This technique has the advantage of facilitating the calculation of the electric field necessary for the correction while ensuring a virtually linear electric field response. On the other hand, the correction necessitates the application of a permanent electric field which is not without posing a problem when it is wished to minimise the electrical consumption of a telescope or instead to avoid heating of said telescope by Joule effect.

There thus exists a need for a system for correcting deformations which makes it possible to obtain a correction of deformations in a durable manner without requiring the application of an electric field in a continuous manner.

SUMMARY OF THE INVENTION

The invention offers a solution to the problems set out previously by taking advantage of the remanence of piezoelectric materials so as to obtain a correction that lasts even when no electric field is applied at the level of the different pixels.

A first aspect of the invention relates to a method for correcting deformations of the surface of an object equipped with a device for correcting deformations, said correction device comprising a piezoelectric layer including a first surface and a second surface, a first plurality of electrical tracks arranged on the first surface of the piezoelectric layer, a second plurality of electrical tracks arranged on the second surface of the piezoelectric layer, the tracks of the first plurality forming a plurality of lines and the tracks of the second plurality forming a plurality of columns, each column of the plurality of columns crossing the lines of the plurality of lines, the crossing of a line and a column forming a pixel. The method according to the invention includes:
- a first step of measuring the deformations of the surface to correct;
- a second step of identifying the pixels necessary for the correction of said deformations;
- a third step of applying, for each identified pixel, by means of the line and the column corresponding to said pixel, an electric field greater than the coercive field of the piezoelectric material of the piezoelectric layer.

Thanks to the invention, once the electric field has been applied a first time, the local curvature of the object at the level of the pixel is modified by bimetal effect between said object and the piezoelectric material and a deformation persists at the level of the selected pixels even when said electric field is no longer present. The invention takes advantage of the phenomenon of remanence, that is to say the property that a piezoelectric material has of conserving a deformation when said material has been exposed to an electric field greater than the coercive field, and to do so even if an electric field is no longer applied to said material. This deformation may be of the order of 0.5% to 1% for a free piezoelectric crystal but varies as a function of the rigidity of the surface to correct. At the end of the method, the deformations are corrected by the deformation of the pixels on which a magnetic field beyond the coercive field has been applied and in a permanent manner. Thus, the correction no longer requires an energy supply once the method according to the invention has been applied. This contrasts with methods of the prior art which do not use remanence in a direct manner and in which only one electric field below the coercive field is applied. An energy supply is thus permanently necessary in order to maintain said electric field.

Apart from the characteristics that have been mentioned in the preceding paragraph, the method according to a first aspect of the invention may have one or more additional characteristics among the following, considered individually or according to all technically possible combinations thereof.

Advantageously, the third step further includes the application, for at least one non-identified pixel, of an electric field less than the coercive field.

Advantageously, the electric field applied to each identified pixel is obtained by the application of a voltage $$\frac{2U}{3}$$

to the line corresponding to said pixel and of a voltage $$-\frac{2U}{3}$$

to the column corresponding to said pixel, the other lines of the plurality of lines and the other columns of the plurality of columns being maintained at a zero voltage, U being the voltage producing an electric field equal to the coercive field when it is applied between the line and the column corresponding to said pixel. Thus it is ensured that only the identified pixels are subjected to an electric field greater than the coercive field. In this case, the electric field seen by the addressed pixels is two times higher than the field seen by the non-addressed pixels.

Advantageously, alternatively, the electric field applied to each identified pixel is obtained by the application of a voltage $$\frac{3U}{4}$$

to the line corresponding to said pixel and of a voltage $$-\frac{3U}{4}$$

to the column corresponding to said pixel, the other lines of the plurality of lines being maintained at a voltage of $$-\frac{U}{4}$$

and the other columns of the plurality of columns being maintained at a voltage of $$\frac{U}{4},$$

U being the voltage producing an electric field equal to the coercive field when it is applied between the line and the column corresponding to said pixel. In this case, the electric field seen by the addressed pixels is three times higher than the field seen by the non-addressed pixels. Thus, polarisation leakage between pixels (known as cross-talk) is reduced.

Advantageously, the method according to a first aspect of the invention comprises a step of applying, to the identified pixels, an alternating field less than the coercive field and greater than the electric field applied to the non-identified pixels. This step makes it possible to stabilise the polarisation of the identified pixels.

Advantageously, the method includes a step of applying, to at least one of the pixels, an alternating electric field of decreasing amplitude from a value greater than the coercive field to a value such that the polarisation of the pixel is less than a predetermined threshold. Thus, it is ensured that the pixel is depolarised.

Advantageously, the method includes a step of applying, to at least one pixel initially polarised by the application of an electric field greater than the coercive field in a first direction, an electric field having a second direction opposite to the first direction and an absolute value greater than the coercive field.

A second aspect of the invention relates to a device for correcting deformations of the surface of an object comprising a piezoelectric layer including a first surface and a second surface, a first plurality of electrical tracks arranged on the first surface of the piezoelectric layer, a second plurality of electrical tracks arranged on the second surface of the piezoelectric layer, the tracks of the first plurality forming a plurality of lines and the tracks of the second plurality forming a plurality of columns crossing the lines of the plurality of lines, the crossing of a line and a column forming a pixel. In addition, the number of columns is equal to k×r with k and r two strictly positive integers and each column has an index i∈[1,k×r], the track forming the column of index i=αk+m with a an integer belonging to [0,r] and m an integer belonging to [1,k] having a width $L_m$ such that $L_m=2^{m-1}L_1$ with $L_1$ the width of the tracks associated with the columns of index i=αk+1.

Thus, it is possible to modulate the deformation by playing on the surface area of the pixels of the correction device by means of the width of the columns. In other words, even when the deformation of each pixel can only take two values, it is possible to modulate the correction by playing on the surface area of the pixels of the device.

Apart from the characteristics that have been set out in the preceding paragraph, the device according to a second aspect of the invention may have one or more additional characteristics among the following, considered individually or according to all technically possible combinations thereof.

Advantageously, the number of lines is equal to k'×r' with k' and r' two strictly positive integers, each line having an index j∈[1,k'×r'] and the track forming the line of index j=βk'+n with β an integer belonging to [0,r'] and n an integer belonging to [1,k'] having a width $L'_n$ such that $L'_n = (2^k)^{n-1} L'_1$ with $L'_1$ the width of the tracks associated with the lines of index j=βk'+1.

Thus, the surface area of the pixels is modulated by the width of the columns but also by the width of the lines.

Advantageously, the piezoelectric layer includes at least one set of three bands, each band of said set having a direction of deformation anisotropy distinct from the directions of deformation anisotropy of the two other bands of the set, each band being arranged facing a line of the plurality of lines.

Advantageously, the direction of deformation anisotropy of one band of the set is chosen as reference direction of deformation anisotropy and the directions of deformation anisotropy of the two other bands of the set form an angle of 60° or −60° with said reference direction.

Thus, it is also possible to take into account the deformation anisotropy by associating with each pixel a deformation anisotropy among the three deformation anisotropies defined by the bands.

Advantageously, the correction device includes a heating system configured to heat all or part of the pixels.

Thus, when the device is operated at low temperature, for example in space where the temperature of the environment may be less than 50 K, it is possible to heat the pixels in order to facilitate the modification of the polarisation thereof.

A third aspect of the invention relates to a mirror equipped with a correction device according to a second aspect of the invention.

A fourth aspect of the invention relates to the use of a device according to a second aspect of the invention for the implementation of the method according to a first aspect of the invention.

The invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION OF AT LEAST ONE EMBODIMENT OF THE INVENTION

Unless stated otherwise, a same element appearing in the different figures has a single reference.

Figure 1:
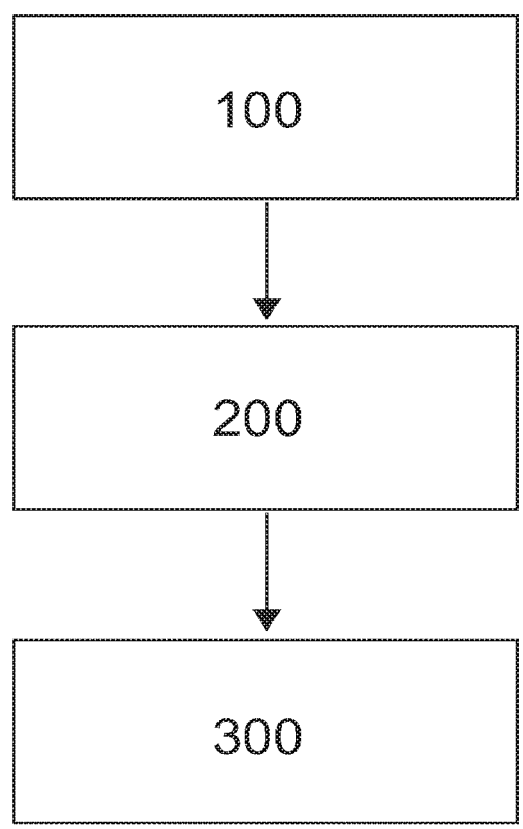
FIG. 1 shows a flowchart of a first embodiment of a method for correcting deformations according to a first aspect of the invention.

A first embodiment of a method for correcting deformations according to a first aspect of the invention is illustrated in FIG. 1. The method for correcting deformations aims to correct the deformation of the surface of an object. To do so, the object is equipped with a deformation correction device illustrated in FIGS. 2A and 2B. The correction device comprises a piezoelectric layer 3 including a first surface S1 and a second surface S2, a first plurality of electrical tracks 1 arranged on the first surface S1 of the piezoelectric layer 3, a second plurality of electrical tracks 2 arranged on the second surface S2 of the piezoelectric layer 3. In addition, the tracks 1 of the first plurality form a plurality of lines 1 and the tracks 2 of the second plurality form a plurality of columns 2, each column 2 of the plurality of columns crossing the lines 1 of the plurality of lines, the crossing of a line 1 and a column 2 forming a pixel 4. As detailed in FIGS. 2A and 2B, the pixel 4 (marked by dotted lines in FIG. 2B) is defined by the crossing of a line 1 and a column 2 and includes the portion of the column 2 facing the line 1, the portion of the line 1 facing the column 2 and the portion of the piezoelectric layer 3 situated between the portion of line and the portion of column belonging to said pixel.

Figure 2A:
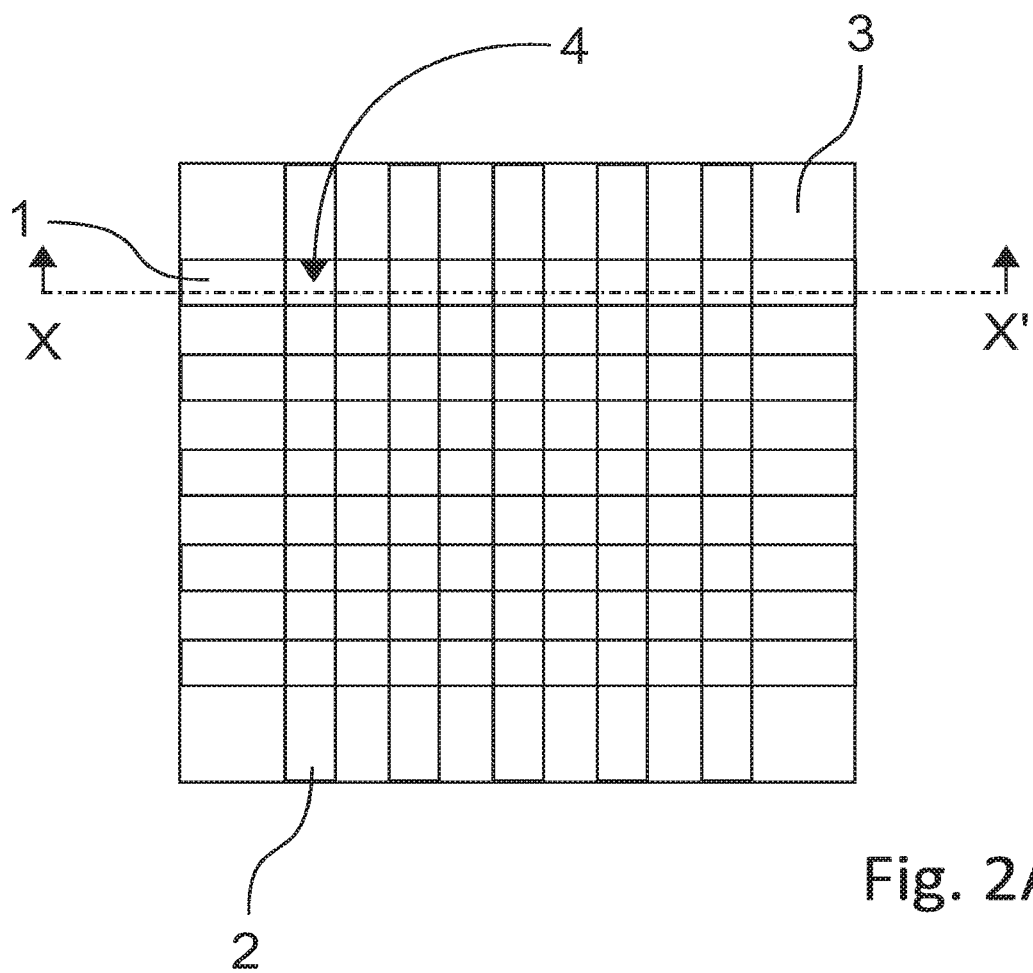
FIGS. 2A and 2B show a schematic representation of a correction device capable of being used in the method according to a first aspect of the invention.
Figure 2B:
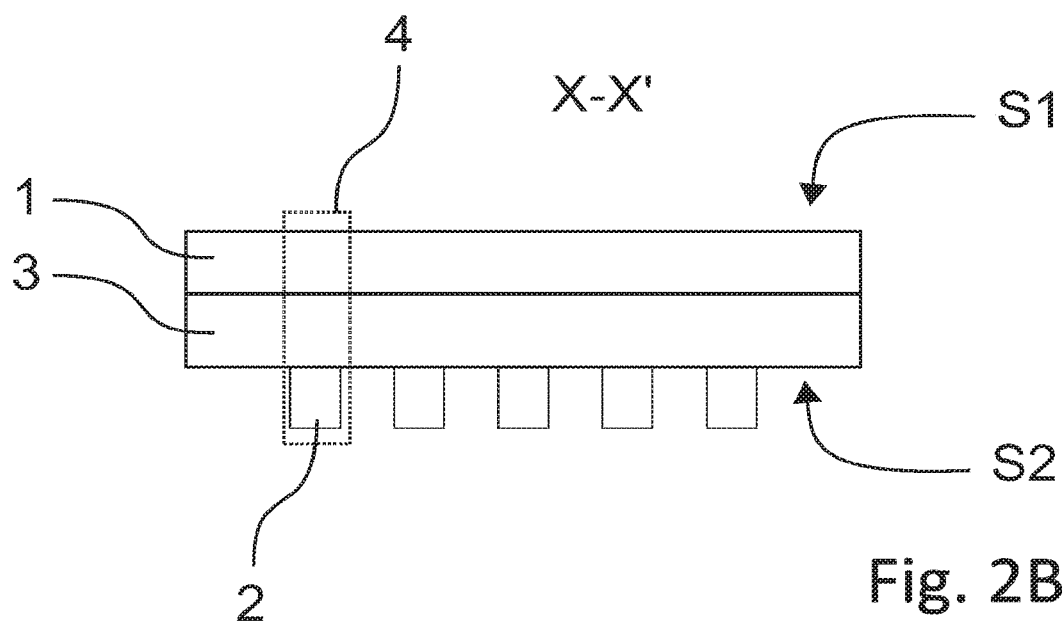
Figure 3A:
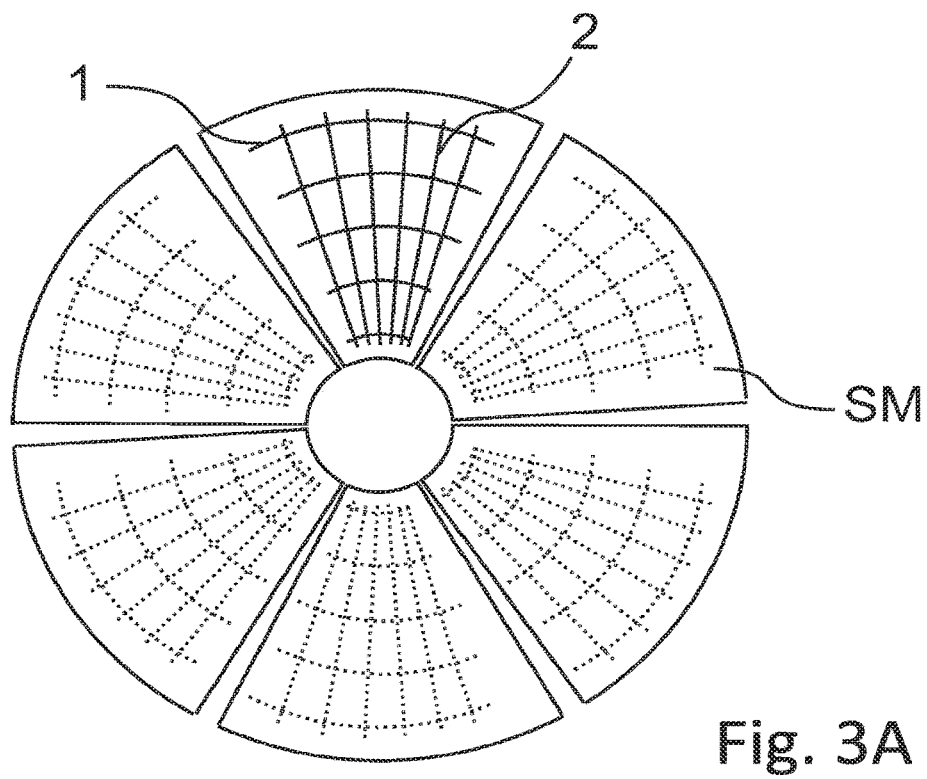
FIG. 3A shows a spherical cap configuration according to one embodiment of the invention.
Figure 3B:
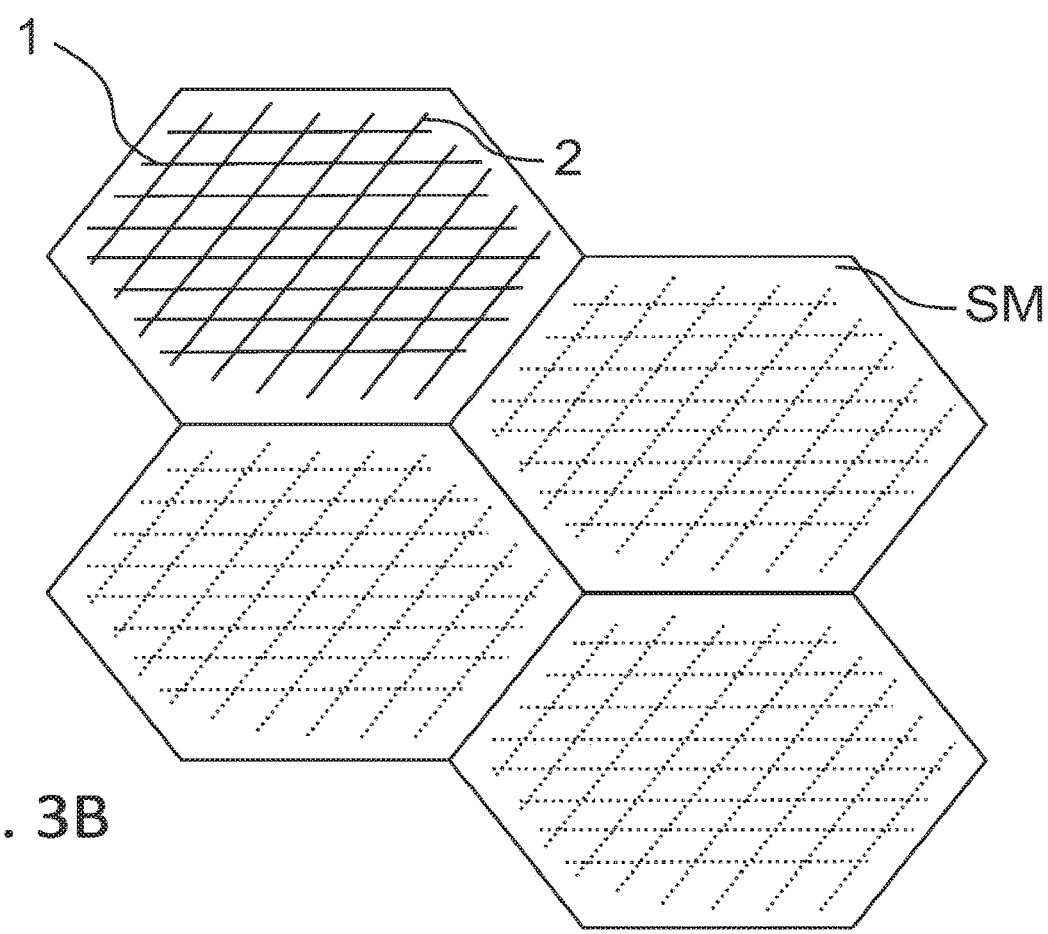
FIG. 3B shows a honeycomb configuration according to one embodiment of the invention.

In FIG. 2A, the lines 1 and the columns 2 cross while forming a right angle but any angle may be envisaged. For example the lines 1 may form concentric circles and the columns 2 extend in a radial manner with respect to these lines 1. Such a configuration is illustrated in FIG. 3A in the case of a spherical cap mirror. Such a mirror is composed of mirror sectors SM, the mirror sectors SM being assembled so as to form a disc. In another example, the lines 1 form a non-zero angle, constant and different to a right angle with the columns 2. Such a configuration is illustrated in FIG. 3B in the case of a honeycomb mirror. Such a mirror is composed of mirror sections SM of diamond shape similar to the shape of a cell of a honeycomb. The lines 1 and the columns 2 cross such that the lines 1 are parallel with at least one first side of the diamond and the columns 2 are parallel with a second side of the diamond different from the first side.

The method according to a first embodiment includes a first step 100 of measuring the deformations of the surface to correct. This first step 100 may notably be carried out by means of an optical method. Other methods may however be envisaged as a function of the nature of the surface to correct, for example by means of a mechanical sensor or by means of a field effect probe (contactless measurement). The method also includes a second step 200 of identifying the pixels necessary for the correction of said deformations. This second step 200 may notably be carried out by numerical calculation, for example by finite elements calculation.

The method further includes a third step of applying 300, for each identified pixel, by means of the line and the column corresponding to said pixel, an electric field greater than the coercive field of the piezoelectric material of the piezoelectric layer.

In a first exemplary embodiment, the object consists of a flat square-shaped mirror with 50 mm sides. The correction device comprises a piezoelectric layer of a thickness of 0.2 mm and the piezoelectric material composing said layer is a piezoelectric material of Pi255 type. The piezoelectric layer has on each of these faces three electrical tracks, the electrical tracks of the first face crossing the electrical tracks of the second face so as to form nine pixels. In order to obtain these electrical tracks, it is for example possible to deposit a metal layer on each of the faces of the piezoelectric layer then to carry out a step of etching in order to constitute said electrical tracks. The coercive electric field of the piezoelectric material being 1100 V/mm and the thickness of the piezoelectric layer being 0.2 mm, it is necessary to apply a voltage greater than 220 V between a line and a column to obtain an electric field greater than the coercive field at the level of the pixel thereby addressed. In order to fasten the correction device to the mirror, a strip of Pyrex brand glass-borax having a thickness of 0.7 mm aluminised beforehand on the front face of the mirror is bonded using epoxy at room temperature to the correction device.

In this exemplary embodiment, the step 100 of measuring deformations of the surface to correct, here the surface of the mirror, is carried out by means of a fringe projection method and measuring the deflection of said fringes. This method has the advantage of being easy to implement. However, it is also possible to resort to an interferometry measurement method or a phase diversity method, even if these methods are more complex to implement.

Step 200 of identifying the pixels necessary for the correction of the deformations is carried out by a finite elements calculation method. It is followed by a step 300 of applying, for each identified pixel and by means of the line and the column corresponding to said pixel, an electric field greater than the coercive field of the piezoelectric material of the piezoelectric layer. The voltage to apply in order to obtain a field greater than the coercive field must be greater than 220V. However, only the identified pixels have to be exposed to such a field. The polarisation of a pixel is thus obtained by the application of a voltage of −150V to the line corresponding to said pixel whereas a voltage of +50V is applied to the other lines. Similarly, a voltage of +150V is applied to the column corresponding to the pixel whereas a voltage equal to −50V is applied to the other columns. The pixel thereby addressed is thus polarised by a voltage of 300V, sufficient to produce an electric field greater than the coercive field. The pixels which have a line or a column in common with the addressed pixel are exposed to a voltage of +/−100V, insufficient to produce an electric field greater than the coercive field and thus to polarise said pixels. Finally, the other pixels are for their part exposed by a voltage of +100V. In other words, only the addressed pixel is polarised. The same addressing set-up is thus applied for each of the identified pixels.

Figure 4:
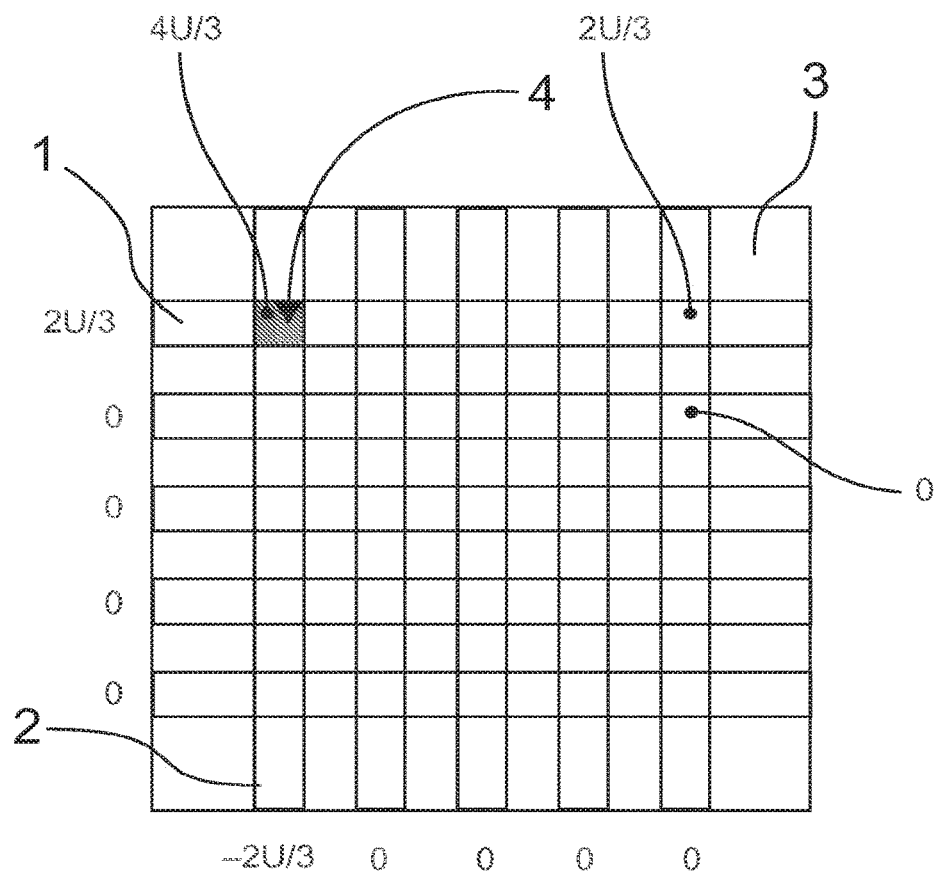
FIG. 4 shows a schematic representation of the voltages of polarisation of the pixels in one embodiment of a method according to a first aspect of the invention.

In one embodiment illustrated in FIG. 4, the electric field applied to each identified pixel 4 (shaded in the figure) is obtained by the application of a voltage $$\frac{2U}{3}$$

to the line corresponding to said pixel 4 and of a voltage $$-\frac{2U}{3}$$

to the column corresponding to said pixel 4, U being the voltage producing an electric field equal to the coercive field when it is applied between the line and the column corresponding to said pixel 4 (it thus depends on the nature of the material of the layer of the piezoelectric and the thickness of said layer). Thus, each pixel 4 that it is wished to polarise may be selected by means of a line 1 and a column 2 and thereby see an electric field applied greater than the coercive field. The other lines of the plurality of lines and the other columns of the plurality of columns are for their part maintained at a zero voltage. In other words, during the polarisation phase, only the selected pixel 4 is exposed to an electric field above the coercive field. Indeed, the pixels 4 having in common with the selected pixel a line 1 or a column 2 only see applied a voltage equal to $$\frac{2U}{3}$$

and thus an electric field less than the coercive field. However, the voltages used in this method of polarising the pixels 4 may give rise to polarisation leakages between pixels 4 (known as cross-talk).

Figure 5:
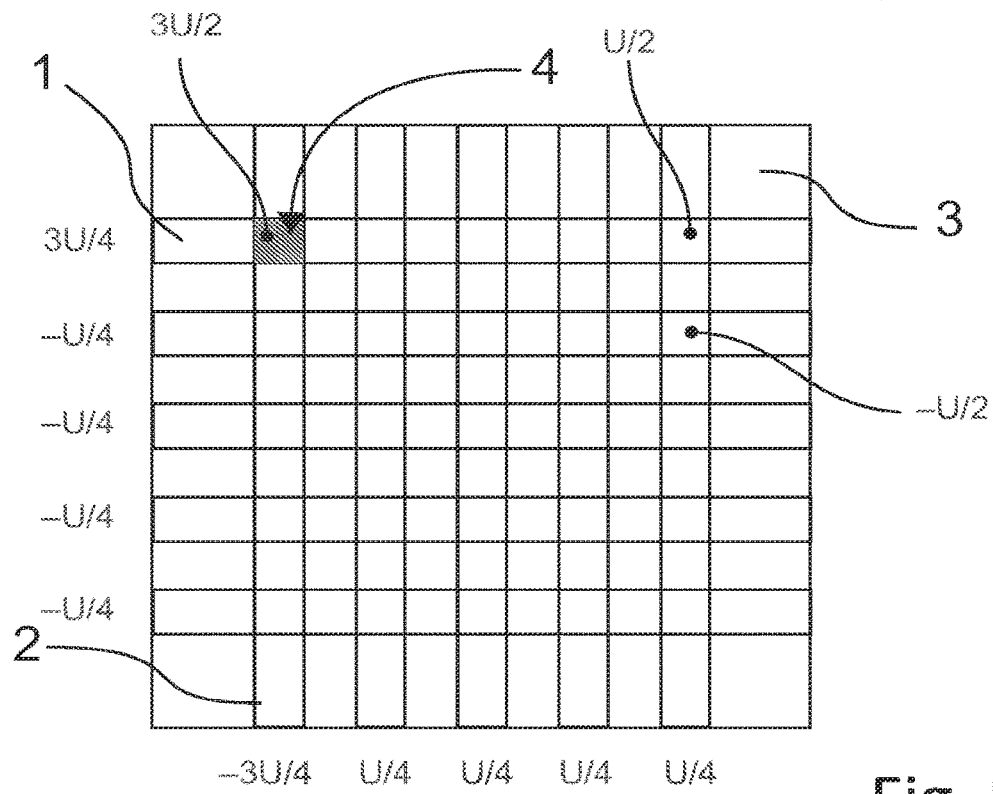
FIG. 5 shows a schematic representation of the voltages of polarisation of the pixels in one alternative embodiment of a method according to a first aspect of the invention.

In order to reduce cross-talk, in one alternative embodiment illustrated in FIG. 5, the electric field applied to each identified pixel 4 is obtained by the application of a voltage $$-\frac{3U}{4}$$

to the line 1 corresponding to said pixel and of a voltage $$\frac{3U}{4}$$

to the column 2 corresponding to said pixel 4 the other lines of the plurality of lines being maintained at a voltage of $$-\frac{U}{4}$$

and the other columns of the plurality of columns being maintained at a voltage of $$\frac{U}{4}.$$

The electric field is thus above the coercive field on the selected pixel. In addition, the voltage at the level of the other pixels is only $$\left|\frac{U}{2}\right|$$

and the electric field at the level of these pixels is less than the coercive field.

In one embodiment, the polarisation of the identified pixels is carried out by addressing said pixels line by line. More specifically, the addressing is carried out in the following manner for each line:

polarisation of the line at a voltage of $$\frac{3U}{4},$$

the other lines being polarised at a voltage of $$-\frac{U}{4};$$

polarisation of the columns relative to the identified pixels corresponding to said line at a voltage of $$-\frac{3U}{4},$$

the other columns being polarised at a voltage of $$\frac{U}{4}.$$

In one embodiment, once the pixel has been polarised, said pixel sees an alternating field applied which is less than the coercive field and greater than the electric field applied to the non-identified pixels. This step makes it possible to stabilise the polarisation of the pixel concerned. For example, in one embodiment, the alternating electric field is equal to 80% of the value of the coercive field. As set out in the two preceding addressing methods, the electric field applied to the non-identified pixels is at the most equal to 50% of the coercive field. In other words, when one of the two previously described addressing methods is used, a field of 80% of the coercive field is less than the coercive field and greater than the electric field applied to the non-identified pixels and is thus suitable for the stabilisation of the polarised pixels.

Before carrying out a measurement of the deformation of the surface of the object to correct, it may be important to ensure that this deformation is not induced by a remanence already present in at least one pixel of the plurality of pixels of the device for correcting deformations of the surface of an object. To achieve this, it may be necessary to carry out a step of depolarisation of the pixels. In an analogous manner, after a first polarisation, if the correction of the deformation is not satisfactory, it may be necessary to cancel the polarisation of one of the polarised pixels. To this end, in one embodiment, the method according to a first aspect of the invention includes a step of applying, to at least one pixel, an alternating field of decreasing amplitude from a value greater than that of the coercive field to a value such that the polarisation of the pixel is less than a predetermined threshold. In one embodiment, all of the pixels are subjected to this alternating field.

In one embodiment, the pixel(s) are depolarised by means of a method such as described in the document "*Fatigue and retention properties of shape memory piezoelectric actuator with non-180° domain switching*", Smart Materials and Structures, 21 (2012). To do so, a field of direction opposite to the field applied initially to polarise the pixel that it is sought to depolarise and of absolute value slightly greater than the coercive field is applied to said pixel. In other words, when it is sought to depolarise a pixel initially polarised by the application of an electric field greater than the coercive field in a first direction, an electric field is applied to said pixel having a second direction opposite to the first direction and an absolute value greater than the coercive field.

As set out previously, in the method according to the invention, the deformation is carried out by the application of an electric field above the coercive field that polarises the pixel(s) 4. For a given pixel, the deformation cannot be modulated but takes place as "all or nothing". In other words, a pixel 4 can only be found in two configurations:
without deformation when no electric field greater than the coercive field has been applied at the level of the pixel 4 or when said pixel has been depolarised; and
deformed when an electric field greater than the coercive field has been applied at the level of the pixel 4 and that the latter is thus polarised.

Figure 6:
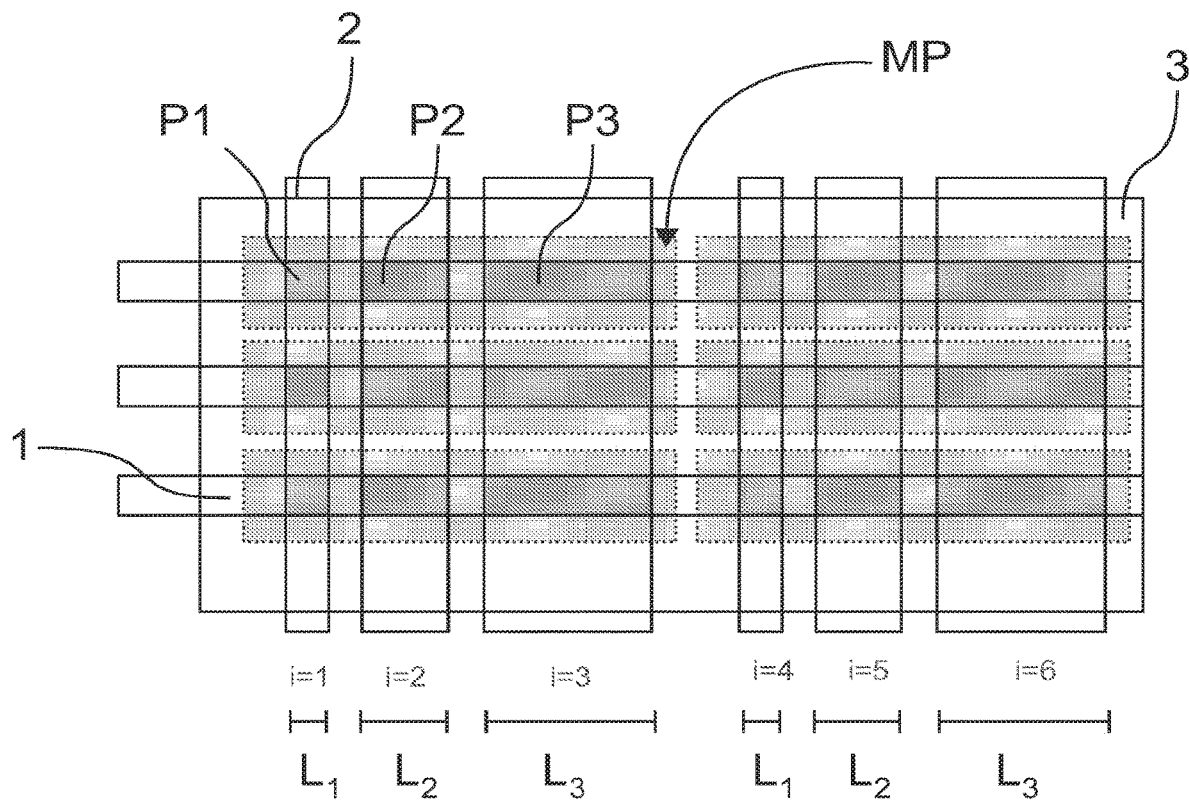
FIG. 6 shows a schematic representation of a first embodiment of a correction device according to a second aspect of the invention.

It may however be interesting to be able to modulate this deformation as a function of requirements. To achieve this, a correction device according to one embodiment of a second aspect of the invention is illustrated in FIG. 6. The device for correcting deformations comprises a piezoelectric layer 3 including a first surface S1 and a second surface S2, a first plurality of electrical tracks 1 arranged on the first surface S1 of the piezoelectric layer 3, a second plurality 2 of electrical tracks arranged on the second surface S2 of the piezoelectric layer 3, the tracks of the first plurality 1 forming a plurality of lines 1 and the tracks of the second plurality 2 forming a plurality of columns 2 crossing the lines of the plurality of lines 1, the crossing of a line 1 and a column 2 forming a pixel 4 (dark shading in FIG. 6).

The correction device further comprises a number of columns 2 equal to k×r with k and r two strictly positive integers and each column has an index i∈[1,k×r]. In addition, the track forming the column 2 of index i=αk+m with α an integer belonging to [0,r] and m an integer belonging to [1,k] has a width $L_m$ such that $L_m=2^{m-1}L_1$ with $L_1$ the width of the tracks associated with the columns 2 of index i=αk+1. In the exemplary embodiment of FIG. 6, the device comprises three lines and the number of columns is such that r=2 and k=3. As illustrated in FIG. 6, the device thus comprises six columns each having an index i ranging from 1 to 6. More specifically, the indices are as follows:
i=1 with α=0 and m=1;
i=2 with α=0 and m=2;
i=3 with α=0 and m=3;
i=4 with α=1 and m=1;
i=5 with α=1 and m=2;
i=6 with α=1 and m=3;

The tracks relative to the columns 2 of index i=1.4 (m=β) have a first width $L_1$, the tracks relative to the columns 2 of index i=2.5 (m=2) have a second width $L_2=2L_1$ and the tracks relative to the columns 2 of index i=3.6 (m=3) have a third width $L_3=2^2L_1$. A series of 12 pixels 4 is thereby obtained. More specifically, six macro-pixels MP (light shading in FIG. 6) are obtained each formed by a first pixel P1, a second pixel P2 and a third pixel P3, said pixels each having a different surface area. By considering the surface area of the first pixel P1 as the unitary surface area, the surface area of the first pixel P1 is equal to 1, the surface area of the second pixel P2 is equal to 2 and the surface area of the third pixel P3 is equal to 4. Since the deformation of a pixel 4 is proportional to its surface area, the macro-pixel MP may thus adopt the deformations listed in table 1.

TABLE 1

| | Value of the deformation | | | | | | | |
|---|---|---|---|---|---|---|---|---|
| | 0 | 1 | 2 | 3 | 4 | 5 | 6 | 7 |
| Pixel(s) to polarise | ø | P1 | P2 | P1, P2 | P3 | P1, P3 | P2, P3 | P1, P2, P3 |

Thus, by choosing to only polarise one pixel or several pixels of a macro-pixel MP, it is thus possible to modulate the deformation. In other words, although the deformation takes place as "all or nothing" at the level of a single pixel, the latter may be modulated at the level of a macro-pixel MP using a coding similar to binary coding. It will thus be understood that the device illustrated in FIG. 6 is particularly suited to the implementation of a method according to a first aspect of the invention.

Figure 7:
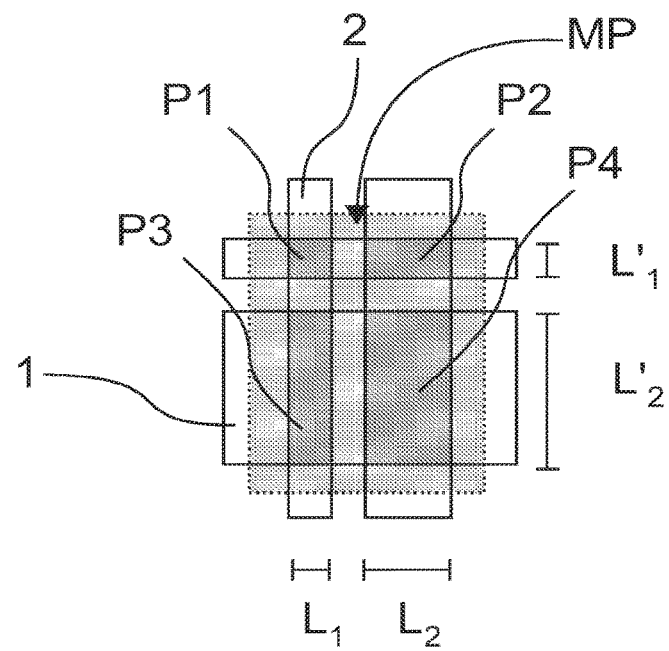
FIG. 7 shows a schematic representation of a second embodiment of a correction device according to a second aspect of the invention.

It is obviously possible to apply the same principle at the level of the lines and to define more complex macro-pixels MP extending over several lines and/or over several columns, the principle remaining the same: to obtain the pixels of a same macro-pixel of which the surface area grows to a power of 2. To do so, in one embodiment illustrated in FIG. 7, the number of lines is equal to k'×r' with k' and r' two strictly positive integers. In addition, each line has an index j∈[1,k'×r'] and the track forming the line of index J=βk'+n with β an integer belonging to [0,r'] and n an integer belonging to [1,k'] has a width $L'_n$ such that $L'_n = (2^k)^{n-1} L'_1$ with $L'_1$ the width of the tracks associated with the lines of index J=βk'+1. In the exemplary embodiment of FIG. 7 (this figure only shows one macro-pixel but a device according to the invention may include several thereof), the columns are chosen such that k=2 and the lines are chosen such that k'=2. There are thus two possible widths for the columns ($L_1$ and $L_2 = 2L_1$) and two possible widths for the lines ($L'_1$ and $L'_2 = (2^2) L'_1 = 4L'_1$). The first pixel P1 has a surface area of $L_1 \times L'_1$, the second pixel P2 has a surface area of $2L_1 \times L'_1$, the third pixel P3 has a surface are of $L_1 \times 4L'_1$ and the fourth pixel P4 has a surface area of $2L_1 \times 4L'_1$. In the same way as previously, by choosing the surface area of the first pixel P1 as unitary surface area and knowing that the deformation of a pixel 4 is proportional to its surface area, the macro-pixel MP may thus adopt the deformations listed in table 2.

TABLE 2

| | Value of the deformation | | | | | | | |
|---|---|---|---|---|---|---|---|---|
| | 0 | 1 | 2 | 3 | 4 | 5 | 6 | 7 |
| Pixel(s) to polarise | ø | P1 | P2 | P1, P2 | P3 | P1, P3 | P2, P3 | P1, P2, P3 |
| | Value of the deformation | | | | | | | |
| | 8 | 9 | 10 | 11 | 12 | 13 | 14 | 15 |
| Pixel(s) to polarise | P4 | P4, P1 | P4, P2 | P4, P1, P2 | P3, P4 | P1, P3, P4 | P2, P3, P4 | P1, P2, P3, P4 |

This embodiment illustrates how the deformation of a macro-pixel MP may be modulated by using in a coordinated manner the width of the lines 1 and the columns 2 so as to put in place a binary coding of the surface area of the pixels 4. The two preceding embodiments, although they make it possible to deal with the problem of modulation of the deformation, do not make it possible on the other hand to take into account problems linked to anisotropic deformations. These problems are posed notably when the material used for the construction of the surface to correct comprises fibres. It is notably the case when the correction of deformations relates to mirrors produced by replication.

Figure 8:
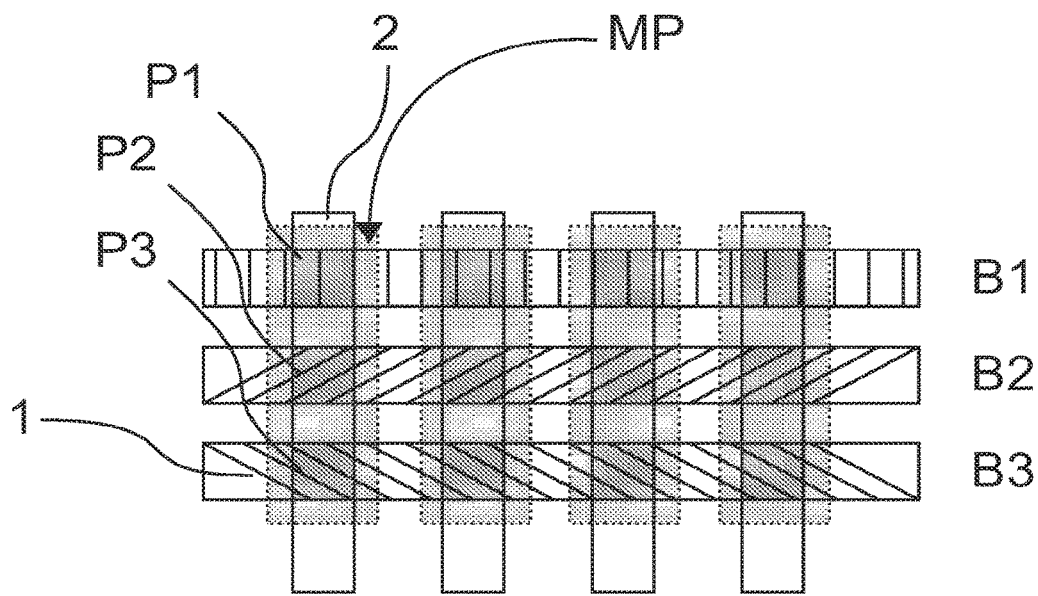
FIG. 8 shows a schematic representation of a third embodiment of a correction device according to a second aspect of the invention.

In order to resolve at least in part this problem, in one embodiment the piezoelectric layer 3 includes at least one set of three bands, each band of the set having a direction of deformation anisotropy distinct from the directions of anisotropy of the other bands of said set. In an exemplary embodiment illustrated in FIG. 8, the piezoelectric layer includes a first band B1, a second band B2 and a third band B3. The direction of deformation anisotropy of one of the bands, here the first band B1, is chosen as reference direction of deformation anisotropy and the other directions of deformation anisotropy form an angle of 60° or −60° with said reference direction. In addition, each band of the plurality of bands is arranged facing a line of the plurality of lines 1. In other words, each line 1 corresponds to a band and each band corresponds to a line 1. The bands may be obtained by using grooved piezoelectric plates or by resorting to piezoelectric fibres, the orientation of the deformation anisotropy then being given by the orientation of the grooves or the orientation of the fibres. In the diagram of FIG. 8 (this figure shows four macro-pixels but a device according to the invention may include a smaller or greater number thereof), the macro-pixel MP is composed of a first pixel P1 having a first deformation anisotropy A1 at 0°, of a second pixel P2 having a second deformation anisotropy A2 at 60° and of a third pixel P3 having a third deformation anisotropy A3 at −60°. The macro-pixel MP thereby obtained makes it possible to select the anisotropy of the deformation among the first A1, the second A2 or the third A3 deformation anisotropy by selecting the corresponding pixel.

Figure 9:
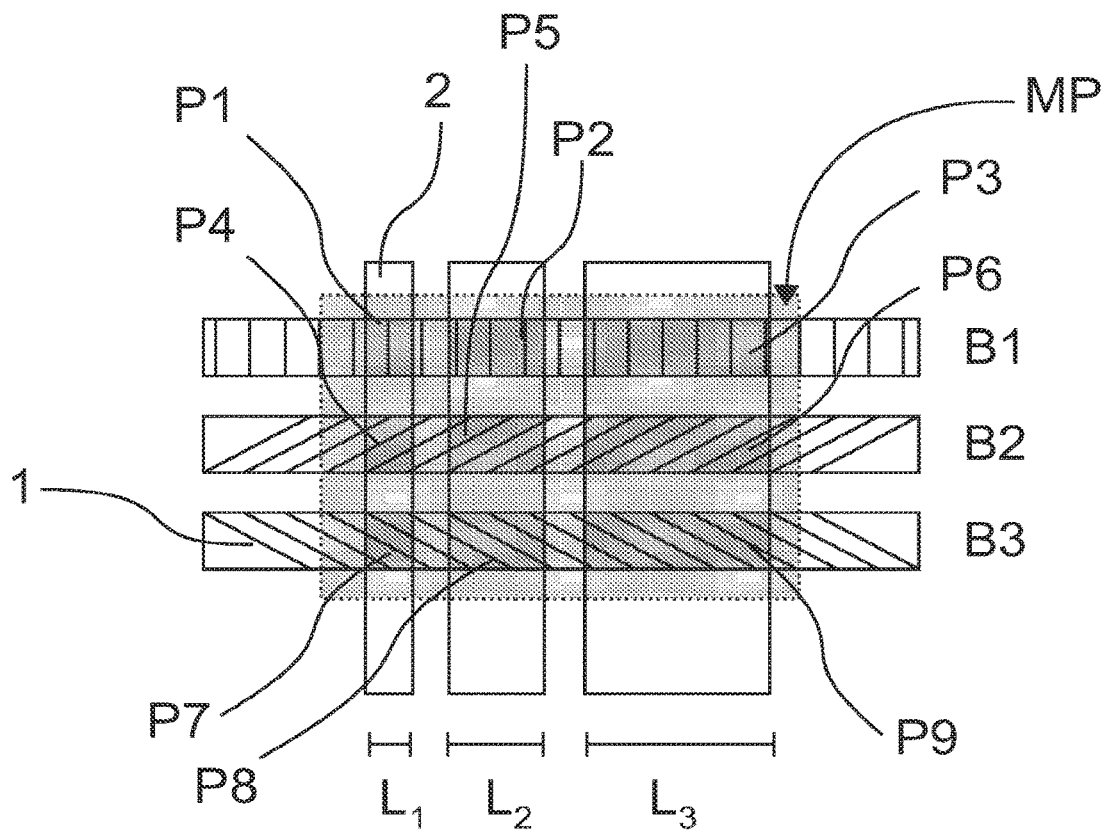
FIG. 9 shows a schematic representation of a fourth embodiment of a correction device according to a second aspect of the invention.

It may however be advantageous to be able to modulate the deformation associated with each deformation anisotropy. To do so, in one embodiment illustrated in FIG. 9 (this figure only shows one macro-pixel but a device according to the invention may include several thereof), the coding of the levels of deformation by the width of the columns is used jointly with the configuration of the piezoelectric layer in piezoelectric bands. The macro-pixel thereby obtained includes a first P1, a second P2, a third P3, a fourth P4, a fifth P5, a sixth P6, a seventh P7, an eighth P8 and a ninth P9 pixel and makes it possible to modulate the deformation for each deformation anisotropy. More specifically, the first P1, second P2 and third P3 pixels associated with the first deformation anisotropy A1 (0°) have respective surface areas of 1, 2 and 4 (the surface area of the pixel P1 being chosen as unitary surface area). The deformation of the macro-pixel MP associated with the first deformation anisotropy A1 may thus take the values listed in table 3.

TABLE 3

| | Value of the deformation | | | | | | | |
|---|---|---|---|---|---|---|---|---|
| | 0 | 1 | 2 | 3 | 4 | 5 | 6 | 7 |
| Pixels to polarise | ø | P1 | P2 | P1, P2 | P3 | P1, P3 | P2, P3 | P1, P2, P3 |

It is the same for the deformations associated with the second deformation anisotropy A2 (60°) by means of the fourth P4, fifth P5 and sixth P6 pixels and with the third deformation anisotropy A3 (−60°) by means of the seventh P7, eighth P8 and ninth P9 pixels.

The embodiments according to the second aspect of the invention show in an obvious manner how, from an "all or nothing" modulation and by creating different bands of anisotropies facing each line, it is possible to obtain a device for correcting errors with which it is possible not only to modulate the deformation and the anisotropy of the latter but moreover for which no energy source is necessary once the corrections have been made.

A possible application of the correction device according to the invention relates to infrared applications for which the mirrors to correct have to operate at low temperature. This applies among others for space mirrors which are cooled radiatively to around 50 K. Yet, when the temperature of the mirror and thus of the piezoelectric materials of the correction device is low, for example less than 180 K, it becomes more difficult to switch polarisation by the application of an electric field. This has the advantage of "freezing" the polarisation and the stress in the material which no longer has a polarisation or shape drift over time but makes the implementation of the correction device more difficult. In order to respond to the difficulty that low temperatures can constitute, in one embodiment, the correction device includes a heating system configured to heat all or part of the pixels. The temperature range compatible with the establishment of the remanent polarisation depends on the piezoelectric materials and lies preferentially in the range of −50° C. to +100° C. The heating system may take the form of a resistant film bonded onto each pixel between two insulating films and crossed by a transversal current. In one preferential embodiment, the power per surface area unit is applied using the heating system by controlling the average temperature of the pixels in such a way as to heat them until reaching a temperature compatible with the modification of the remanent polarisation (for example above 220K). In one embodiment, the regulation of the power per surface area unit applied using the heating system is carried out by means of a local enslavement of the temperature of the pixels. The temperature thereby obtained is preferably maintained throughout the duration of the method for correcting deformations. The heating may take place at the scale of the device or instead locally, in a selective manner, on one or more pixels.

The invention claimed is:

1. A method for correcting deformations of a surface of an object equipped with a correction device for correcting deformations, said correction device comprising a piezoelectric layer including a first surface and a second surface, a first plurality of electrical tracks arranged on the first surface of the piezoelectric layer, a second plurality of electrical tracks arranged on the second surface of the piezoelectric layer, the electrical tracks of the first plurality forming a plurality of lines and the electrical tracks of the second plurality forming a plurality of columns, each column of the plurality of columns crossing the lines of the plurality of lines, the crossing of a line and a column forming a pixel, each pixel comprising a portion of the crossing column facing the crossing line, a portion of the crossing line facing the crossing column and a portion of the piezoelectric layer situated between the portion of the crossing line and the portion of the crossing column belonging to said pixel, said method comprising:

a first step of measuring the deformations of the surface to correct;

a second step of identifying the pixels necessary for the correction of said deformations; and a third step of applying, for each identified pixel, by means of the line and the column corresponding to said pixel, an electric field greater than the coercive field of the piezoelectric material of the piezoelectric layer.

2. The method according to claim 1, wherein the third step includes the application, for at least one non-identified pixel, of an electric field less than the coercive field.

3. The method according to claim 1, wherein the electric field applied to each identified pixel is obtained by the application of a voltage $$\frac{2U}{3}$$

to the line corresponding to said pixel and of a voltage $$-\frac{2U}{3}$$

to the column corresponding to said pixel, the other lines of the plurality of lines and the other columns of the plurality of columns being maintained at a zero voltage, U being the voltage producing an electric field equal to the coercive field when it is applied between the line and the column corresponding to said pixel.

4. The method according to claim 1, wherein the electric field applied to each identified pixel is obtained by the application of a voltage $$\frac{3U}{4}$$

to the line corresponding to said pixel and of a voltage $$-\frac{3U}{4}$$

to the column corresponding to said pixel, the other lines of the plurality of lines being maintained at a voltage of $$-\frac{U}{4}$$

and the other columns of the plurality of columns being maintained at a voltage of $$\frac{U}{4},$$

U being the voltage producing an electric field equal to the coercive field when it is applied between the line and the column corresponding to said pixel.

5. The method according to claim 1, further comprising a step of applying, to the identified pixels, an alternating field less than the coercive field and greater than the electric field applied to the non-identified pixels.

6. The method according to claim 1, further comprising applying, to at least one of the pixels, of an alternating electric field of decreasing amplitude from a value greater than that of the coercive field to a value such that a polarisation of the at least one pixel is less than a predetermined threshold.

7. The method according to claim 1, further comprising a step of applying, to at least one pixel initially polarised by the application of an electric field greater than the coercive field in a first direction, an electric field having a second direction opposite to the first direction and an absolute value greater than the coercive field.

8. The method according to claim 1, wherein the object is a mirror and the surface to correct is a reflective surface of said mirror.

* * * * *